US012663455B2

(12) United States Patent
Cosentino

(10) Patent No.: US 12,663,455 B2
(45) Date of Patent: Jun. 23, 2026

(54) RADIOFREQUENCY DETECTOR CIRCUIT AND CORRESPONDING RADIOFREQUENCY DETECTION METHOD

(71) Applicant: STMicroelectronics International N.V., Geneva (CH)

(72) Inventor: Gaetano Cosentino, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 168 days.

(21) Appl. No.: 18/818,009

(22) Filed: Aug. 28, 2024

(65) Prior Publication Data

US 2025/0110161 A1 Apr. 3, 2025

(30) Foreign Application Priority Data

Sep. 29, 2023 (IT) ......................... 102023000020073

(51) Int. Cl.
*G01R 29/08* (2006.01)
*G01R 19/02* (2006.01)

(52) U.S. Cl.
CPC ......... *G01R 29/0878* (2013.01); *G01R 19/02* (2013.01)

(58) Field of Classification Search
CPC ........................... G01R 29/0878; G01R 19/02
See application file for complete search history.

(56) References Cited

U.S. PATENT DOCUMENTS 9,601,995 B1 3/2017 Mukherjee et al.
2023/0067052 A1* 3/2023 Vogt ................... H03K 5/00006

OTHER PUBLICATIONS

Mostafa Yargholi,"A highly linear squarer design for energy-detection RF receivers", Microelectronics Journal, vol. 44, Issue 8, 2013, pp. 658-662, ISSN 1879-2391, https://www.sciencedirect.com/science/article/pii/S0026269213001213.*
Guiliary, Jules Ravanne et al., "A Linear-in-decibel RF Power Detector for Microwave Measurements in the S-band Frequency using CMOS Technology", 2021 IEEE 12th Annual Information Technology, Electronics and Mobile Communication Conference (IEMCON), IEEE, Oct. 27, 2021 (Oct. 27, 2021), pp. 805-810, XP034039442.

(Continued)

*Primary Examiner* — Stephanie E Bloss
*Assistant Examiner* — Michael A Harrison
(74) *Attorney, Agent, or Firm* — Slater Matsil, LLP

(57) ABSTRACT
A radiofrequency detector comprises a squarer circuit comprising first and second branches coupled between a voltage supply and ground, the first branch comprising at least a first squarer transistor receiving a RF sinusoidal input voltage, the first squarer transistor being coupled to the voltage supply through a respective load, the second branch comprising a second reference transistor being coupled to the voltage supply through a respective load, an output voltage being formed at an output node of the first branch and a reference voltage being formed at a respective output node coupled to the load of the second branch, a squared voltage being obtained by a difference voltage of the output voltage and reference voltage, wherein the circuit is configured to feed back to a control electrode of the second reference transistor a feedback signal that is a function of the difference voltage.

20 Claims, 5 Drawing Sheets

(56) References Cited

OTHER PUBLICATIONS

Stmicroelectronics International N.V., "Rapporto Di Ricerca", Ministero delle Impreses e del Made in Italy, Italian Application No. 202300020073, 10 pages, Mar. 15, 2024.
Zhou, Yijun et al., "A Low-Power Ultra-Wideband CMOS True RMS Power Detector", IEEE Transactions on Microwave Theory and Techniques, IEEE, USA, vol. 55, No. 5, May 1, 2008 (May 1, 2008), pp. 1052-1058.

* cited by examiner

RADIOFREQUENCY DETECTOR CIRCUIT AND CORRESPONDING RADIOFREQUENCY DETECTION METHOD

CROSS-REFERENCE TO RELATED APPLICATIONS

This application claims the benefit of Italian Patent Application No. 102023000020073, filed on Sep. 29, 2023, which application is hereby incorporated herein by reference.

TECHNICAL FIELD

The description relates to a radiofrequency detector comprising a squarer circuit comprising first and second branches coupled between a voltage supply and ground, the first branch comprising at least a first squarer transistor receiving a RF sinusoidal input voltage, the first squarer transistor being coupled to the voltage supply through a respective load, the second branch comprising a second reference transistor, the second reference transistor being coupled to the voltage supply through a respective load, an output voltage being formed at an output node of the first branch and a reference voltage being formed at an output node of the second branch, a squared voltage being obtained by a difference voltage of the output voltage and reference voltage.

One or more embodiments may be applied e.g. to RF apparatuses, such as RF receivers or transceivers (RX or RTX), in particular comprising RF Automatic Gain Control, or high frequency analog processing.

BACKGROUND

Radiofrequency (RF) detectors to detect and measure the strength or presence of RF signals, e.g. received through an antenna or an RF input port, may use a squarer circuit to convert the RF signal into a squared output signal. The RF signal may come from various sources, such as radio transmitters, wireless communication devices, or other RF-emitting devices.

The amplified RF signal may be fed into the squarer circuit, for instance after amplification. The squarer circuit is designed to multiply the input signal by itself, resulting in an output signal that represents the squared value of the input.

The squarer circuit uses nonlinear elements such as diodes or transistors to perform the squaring operation. These nonlinear elements generate harmonics and effectively multiply the input signal by itself. The squared output signal from the squarer circuit may be filtered to remove harmonics and unwanted frequency components, e.g. with a low-pass filter. The filtered output of the squarer circuit represents the squared value of the RF signal amplitude. This squared value can be utilized to detect the presence or strength of the RF signal. It can be further processed by additional circuitry to measure power level of the signal or to trigger specific actions based on certain thresholds. The squared output represents an indication of the RF signal strength, which can be further processed for various applications, including RF power measurement, signal detection, or interference monitoring.

In this regard in FIG. 1A it is shown schematically a circuit diagram of an RMS squarer core according to the prior art. In particular it is shown a single ended RMS square core circuit 10 comprising a first squarer transistor, in particular a metal-oxide-semiconductor field-effect transistor (MOSFET), M1, which receives a radiofrequency voltage Vrf, which may correspond to a sinusoidal voltage with frequency w and input voltage amplitude Vi, e.g Vi*cos(wt), at its gate. The first squarer MOSFET M1 has its drain electrode coupled to a voltage supply Vcc through a respective first load ZL1 comprising a load resistance RL1 and a load capacitor CL1 in parallel.

The source of the first, squarer, MOSFET M1 is coupled to the ground GND, so that between gate and ground GND is applied a voltage Vrf+Vgs, Vgs being the bias gate source voltage applied to the first squarer MOSFET M1.

The single ended RMS square core circuit 10 comprises then a second, reference, transistor, in the example a MOSFET like transistor M1, M2, which also has its drain electrode coupled to the voltage supply Vcc through a respective second load ZL2 comprising a load resistance RL2 and a load capacitor CL2 in parallel, with the same values of the first load ZL1 of the first squarer MOSFET M1.

The source of the second reference MOSFET M2 is coupled to the ground GND, so that between gate and ground GND there is a gate source voltage, Vgs being also the bias gate source voltage of the second reference MOSFET M2, equal to the bias gate source voltage Vgs of the first squared MOSFET M1, as transistors M1 and M2 are identical MOSFETs, e.g. matching MOSFETs or MOSFETs with the same design, in particular aspect ratio.

A difference output voltage Vdiff is measured between the two drain electrodes, i.e. outputs, of the MOSFETs M1 and M2.

The difference output voltage Vdiff can be evaluated as follow, by calculating the drain source current ids1 and ids2 of MOSFETS M1 and M2:

$$ids1 = \frac{unCox}{2} \cdot \frac{W}{L} \cdot (Vrf + Vgs - Vt)^2$$

$$ids2 = \frac{unCox}{2} \cdot \frac{W}{L} \cdot (Vgs - Vt)^2$$

$$Vrf = Vi * \cos(wt)$$

The difference output voltage, measured between Vout, the voltage at the drain of the first MOSFET M1, and Vref, the voltage at the drain of the second MOSFET M2 is then $$Vdiff = Rload * \left\{ \frac{unCox}{4} \cdot \frac{W}{L} \cdot Vi^2 \right\}.$$

The two MOSFET M1 and M2 are substantially identical thus they have the same aspect ratio W/L (width W to length L) and the same silicon oxide capacity unCox. Thus, their drain source currents ids1, ids2 differ only by the presence of the radiofrequency voltage Vrf, which is a sinusoidal voltage with frequency w and input voltage amplitude Vi, in the first drain source current ids1. Thus the difference output voltage Vdiff is proportional to the square of the input voltage amplitude Vi.

The solution described in FIG. 1A is single ended, i.e. the sinusoidal voltage Vrf is applied to the gate of the first squarer MOSFET M1.

In FIG. 1B it is shown a differential implementation 10' of the circuit 10, which comprises the same two branches of circuit 10, however in the squarer branch, instead of only one first MOSFET M1, there are a first MOSFET M1n receiving at input, i.e. the gate, the negative portion Vrfn of the differential RF input signal and a first MOSFET M1p receiving at input the positive portion Vrfp of the differential RF input signal, which are in parallel, i.e. their drains are coupled together to the load ZL and the sources to ground GND.

Such type of squarer circuit is subject to some drawbacks, as an input offset may degrade the sensitivity, while a calibration method is necessary to get functionality in the power target range (e.g., −25 . . . −5 dBm).

Then, a low pass filter characteristic (hundreds of KHz) it may be necessary to extract the RMS voltage of wide band digital modulation (10 MHz OFDM for example) avoiding the dynamic voltage variation in the load resistance, e.g. RL1, considering that the digital modulation can have crest factor up to 12 dB.

The known RF detectors cannot offer enough sensitivity for RF low power input level, and often need a trimming and/or calibration procedure, or sometimes complex artefacts with digital loops to get the necessary minimum sensitivity and the dynamic range required from, e.g., RF AGC closed loop systems.

SUMMARY

An object of one or more embodiments is to contribute in dealing with a number of issues which are recognized to exist in a context as discussed in the foregoing.

According to one or more embodiments that object may be achieved by means of a detector having the features set forth in the claims that follow.

One or more embodiments may relate to a corresponding method of detection.

As mentioned previously, various embodiments of the present disclosure regard a radiofrequency detector comprising a squarer circuit comprising a first and second branch coupled between a voltage supply and ground, the first branch comprising at least a first squarer transistor receiving a RF sinusoidal input voltage, the first squarer transistor being coupled to the voltage supply through a respective load, the second branch comprising a second reference transistor receiving a RF sinusoidal input voltage, the second reference transistor being coupled to the voltage supply through a respective load, an output voltage being formed at an output node of the first branch and a reference voltage being formed at a respective output node, in particular coupled to the load of the second branch, a squared voltage being obtained by a difference voltage of the output voltage and reference voltage. wherein the circuit is configured to feed back to a control electrode of the second reference transistor a feedback signal, which is function of the difference voltage.

In variant embodiments, the circuit comprises a sense amplifier to which inputs are coupled the output voltage and the reference voltage, the sense amplifier being configured to output a signal proportional to the difference voltage of the signals at the inputs of the sense amplifier, which is applied to a control electrode of the second reference transistor.

In variant embodiments, the squarer circuit (comprises a cascode transistor on each of the first branch and second branch, arranged between the first or second transistor respectively, and a current steering circuit injecting current in the node in common between the first or second transistor and the respective cascode transistor (Mcasc1, Mcasc2).

In variant embodiments, the control electrode of the second reference transistor is the gate of the second reference transistor.

In variant embodiments, the control electrode of the second reference transistor is a bulk electrode gate of the second reference transistor.

In variant embodiments, it comprises a low pass filter receiving the output voltage and the reference voltage and outputting corresponding low pass filtered signals to the inputs the sense amplifier.

In variant embodiments, the squarer circuit is single ended.

In variant embodiments, the squarer circuit is differential and comprise two squarer transistors in parallel receiving at input the positive and negative RF input signal.

In variant embodiments, the first and second transistor are MOSFETs.

In variant embodiments, the detector comprises an envelope detector coupled at least to the output voltage comprising at least a p-channel MOS (pMOS) coupled by its gate to at least one of the first and second branch and which output node is coupled through a respective capacitor to a voltage supply node or to a ground reference node.

In variant embodiments, the envelope detector comprises a second pMOS receiving at its gate the reference voltage and which output is coupled to the power supply by a further respective capacitor, in particular the output of the first and second pMOS being coupled to a respective buffer.

In variant embodiments, the envelope detector is applied a respective detector reference voltage (to the gate of the at least a pMOS, the respective capacitor being coupled to ground and to the input of a differential amplifier which output is coupled to the gate of a second pMOS which output is coupled back to the other input of the differential amplifier, in particular the output of the second pMOS, in particular its source.

In variant embodiments, the source of the first pMOS and/or of the second pMOS is coupled to the supply voltage through a decay current generator injecting a decay current in the source of the first pMOS.

In variant embodiments, the output of the buffer or the output of the second pMOS is coupled to an analog to digital converter.

The solutions here described relate also to a method for radiofrequency detection comprising a detector according to embodiments comprising feeding back to a control electrode of the second reference transistor a feedback signal, which is a function of the difference voltage.

The claims are an integral part of the technical disclosure of the embodiments as provided herein.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figures 1A, 1B:
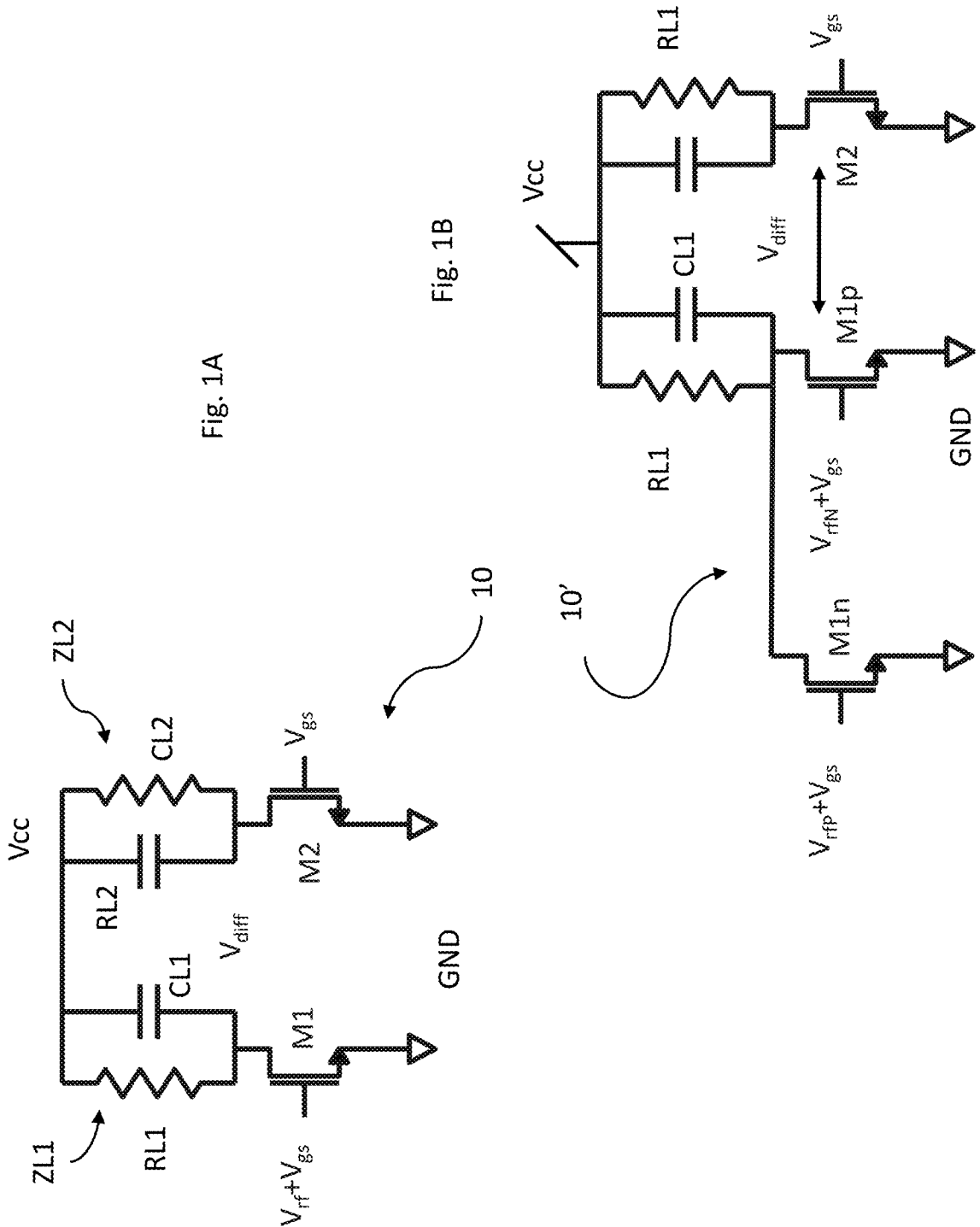
FIGS. 1A and 1B are schematic representations of RMS squarer cores.
Figure 2:
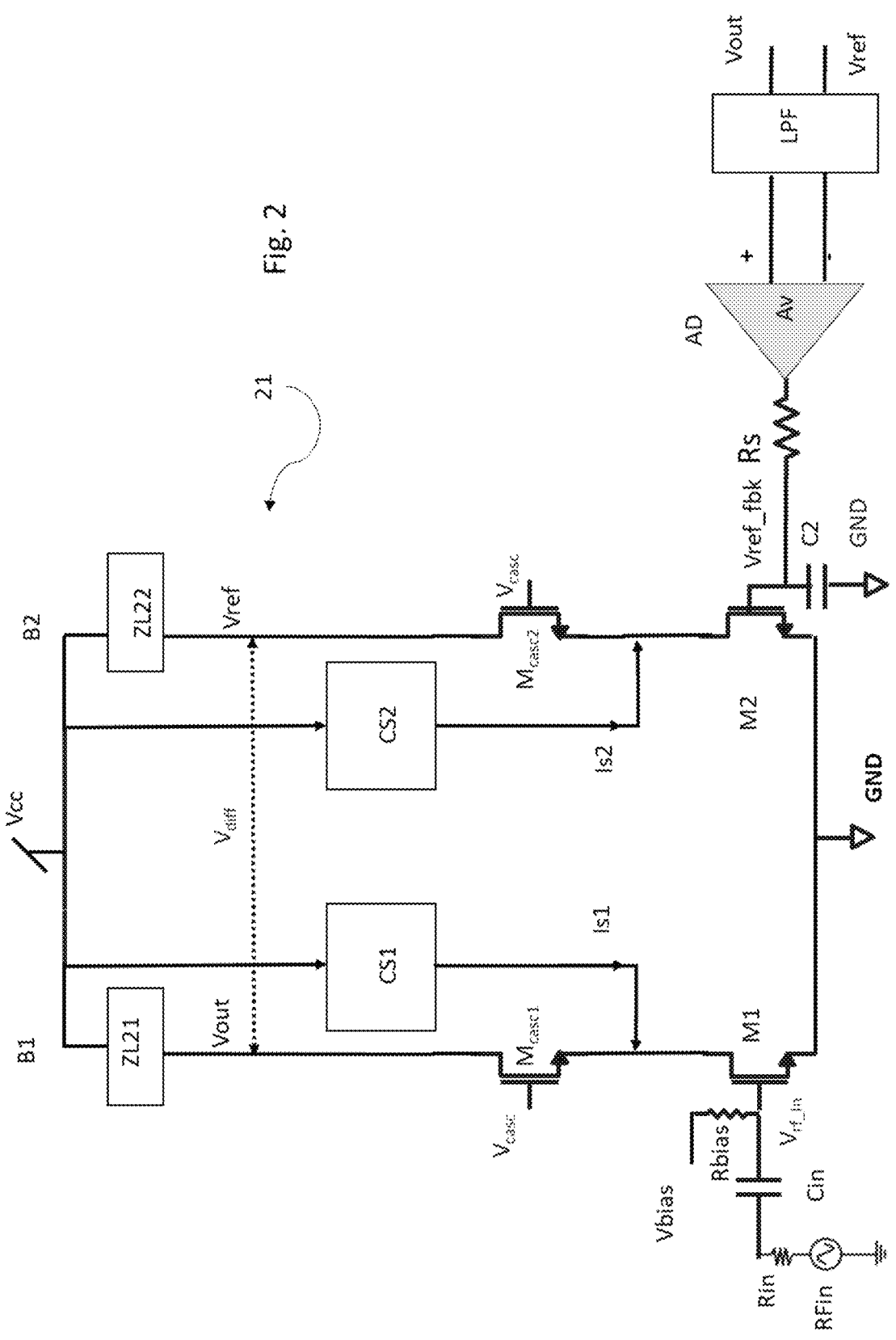
FIG. 2 is a schematic representation of a radiofrequency detector core according to embodiments.

In FIG. 2 it is shown schematically the circuit of a RF detector core 21 according to the solutions here described. The RF detector core comprises, similarly to FIG. 1, a pair of MOSFET M1 and M2, identical as the MOSFETs of FIG. 1, a first squarer MOSFET M1 and a second reference MOSFET M2, identifying a respective squarer branch B1 and reference branch B2, in parallel between voltage supply Vcc and ground GND.

An input radio frequency voltage RFin, e.g. by a RF antenna, is applied, in particular through a RC series circuit (Rin, Cin), as input voltage Vrf, in to the gate of a first squarer MOSFET M1 arranged on the squarer branch B1 in a cascoded manner, i.e. with a squarer cascode MOSFET Mcasc1 coupled to its drain, biased by a cascode voltage Vcase on its gate, then the squarer cascode MOSFET Mcasc1 is coupled to the voltage supply Vcc by a respective squarer load ZL21. The squarer load ZL2, 1ZL could be either embodied, among others, by a diode connected MOS or a resistor, coupled between the voltage supply Vcc and the drain of the the squarer cascode MOSFET Mcasc1, as indicated in FIG. 2.

A current steering circuit CS1 coupled between the supply voltage Vcc and the drain of the MOSFET M1 (source of the squarer cascode MOSFET Mcasc1) injects a steering current IS1 in such drain of the first squarer MOSFET M1. The current steering circuit CS1 may be embodied by a steering resistor, i.e. drawing current to the drain of the MOSFET M1, or by a steering current generator. The current steering circuit CS1 is optional, in embodiments may not be present in the RF detector core circuit 21.

In the same way, the second reference MOSFET M2 is cascoded with a reference cascode MOSFET Mcasc2 coupled to its drain, biased by the cascode voltage Vcase, then the reference cascode MOSFET Mcasc2 is coupled to the voltage supply Vcc by the load ZL22. The load ZL22 may be embodied as well by a resistance or a diode connected load MOSFET. MOSFET M2 and M1 are coupled to the same ground.

A current steering circuit CS2, which also may be option and in embodiments may be not comprised in the RF detector core circuit 21, coupled between the supply voltage Vcc and the drain of the second MOSFET M2 injects a steering current IS2 in to such drain of the second MOSFET M2. The current steering circuit CS2 may be embodied by a steering resistor, i.e. drawing current to the drain of the second MOSFET M2, or by a steering current generator.

The second reference MOSFET M2 receives at its control input, in the example the gate electrode, a feedback reference voltage Vref_fbk, which is obtained by supplying the respective voltages Vout and Vref, i.e., the voltages at the output of the two branches B1 and B2, taken on the loads ZL21 and ZL22, thus formed in this case on the drains of the cascode MOSFETs Mcasc1 and Mcasc2, to a voltage sense amplifier AD after a low pass filtering in a low pass filter LPF. The gate of the second reference MOSFET M2 is also coupled to ground GND by a capacitor C2.

The input voltage Vrf_in is supplied to the gate of the first squarer MOSFET M1 through an input resistance Rin and an input capacitance Cin while a bias resistance Rbias is also coupled to the gate of the first MOSFET M1, through which, by applying a bias voltage Vbias, is provided a bias reference mirror current to the gate of the first MOSFET M1.

Thus, substantially, the core 21 of the RF power detector is based on a half wave squarer structure, i.e. pair of MOSFET M1 and M2.

The single ended input voltage $V_{rf\_In}$ feeds the gate of the first MOSFET M1. The input capacitor Cin reactance is dominant with respect to the bias resistance Rbias at the working frequency of the detector circuit 21.

The input voltage $V_{rf\_In}$ positive half wave applied to the first MOSFET M1 provides a current proportional to the square of the amplitude Vi of the sinusoidal input voltage $V_{rf\_In}$, being also here Vrf, In=Vi*cos(wt) as in the circuit 10. Such current flowing into the first branch B1 load ZL21 gives a voltage swing proportional to the RF input power of the input voltage $V_{rf\_In}$.

The two cascode MOSFET Mcasc1 and Mcasc2 on the two branches B1 and B2 allow to reduce lambda effect and to increase the transconductance of the MOSFET M1 and M2 thanks to the current steering by the respective steering circuits CS1 and CS2.

The voltage sense amplifier AD senses the voltages Vout and Vref at the output of the two branches B1 and B2 respectively through the low pass filter LPF, which filters each of voltages Vout and Vref, and closes the loop acting on the feedback reference voltage $V_{ref\_fbk}$ applied to the control input of the second reference MOSFET M2. At steady state such loop sets the reference voltage Vref to the mean value of the RF input level, i.e., mean value of the amplitude Vi of the RF input voltage $V_{rf\_In}$. A series output resistance RS is also indicated on the output of the voltage series amplifier AD, through which the voltage series amplifier AD is coupled to the control input of the second MOSFET M2.

Thus, the low pass filter LPF outputs thus provides the DC or low pass components of voltages Vout and Vref, and the loop forces them to be equal, shorting voltages Vout and Vref inside the DC removal loop bandwidth.

Figure 3:
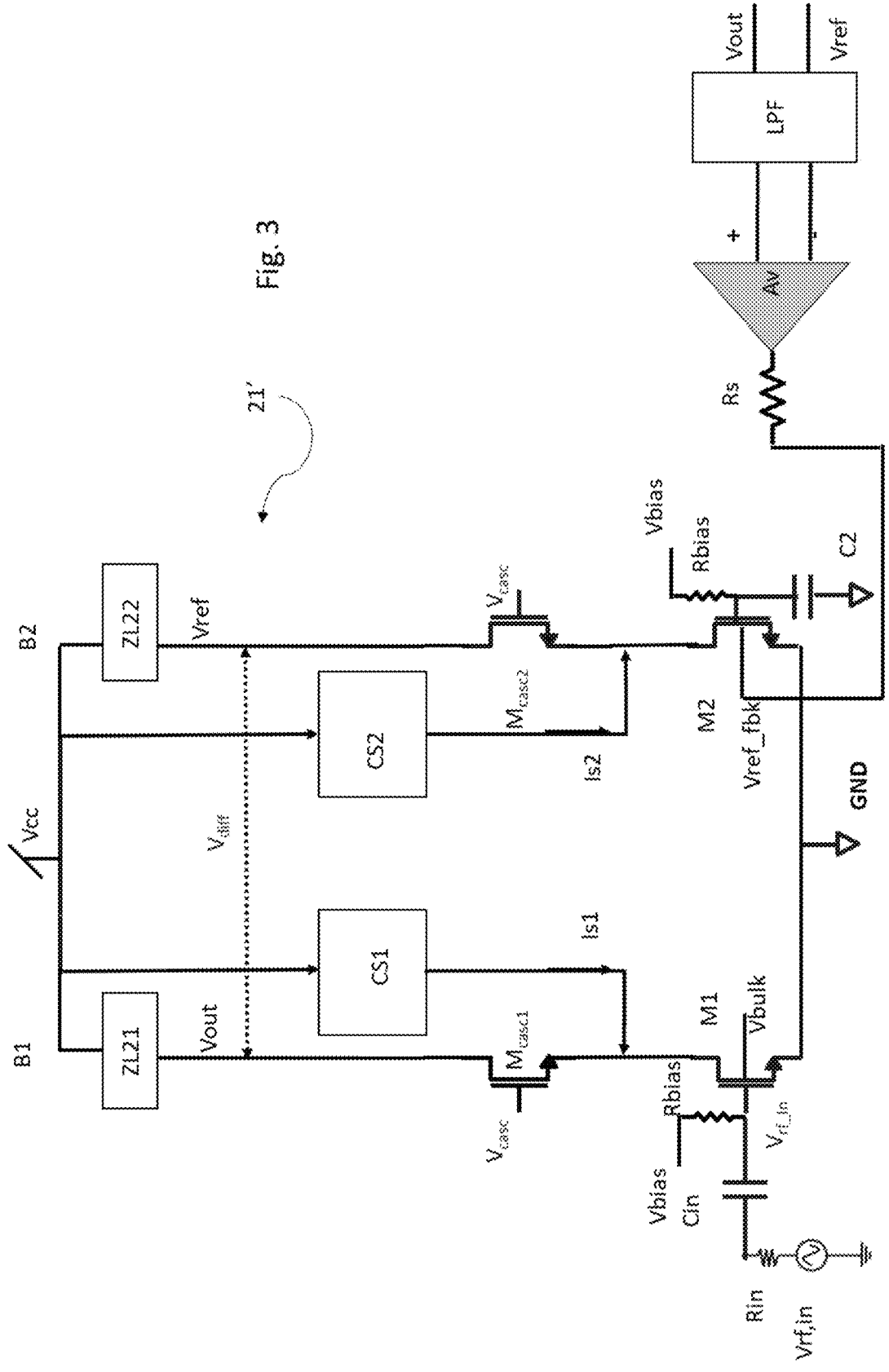
FIG. 3 is a schematic representation of a variant of the radiofrequency detector core of FIG. 2.

In FIG. 3 it is shown a variant 21' of the RF detector core 21. In this case the only difference with respect to circuit 21 of FIG. 2 is that the output of the voltage sense detector AD is coupled to the bulk gate voltage of the second reference MOSFET M2, the corresponding electrode or terminal in the bulk of the MOSFET operating as control electrode. The gate of the second MOSFET M2 in this case is coupled to a bias voltage Vbias through a respective resistance Rbias like the first MOSFET M1. This type of coupling of the the feedback reference voltage $V_{ref\_fbk}$ to the second branch may be used for instance in connection to the use of FD-SOI (Fully Depleted Silicon On Insulator) technologies.

Figure 4:
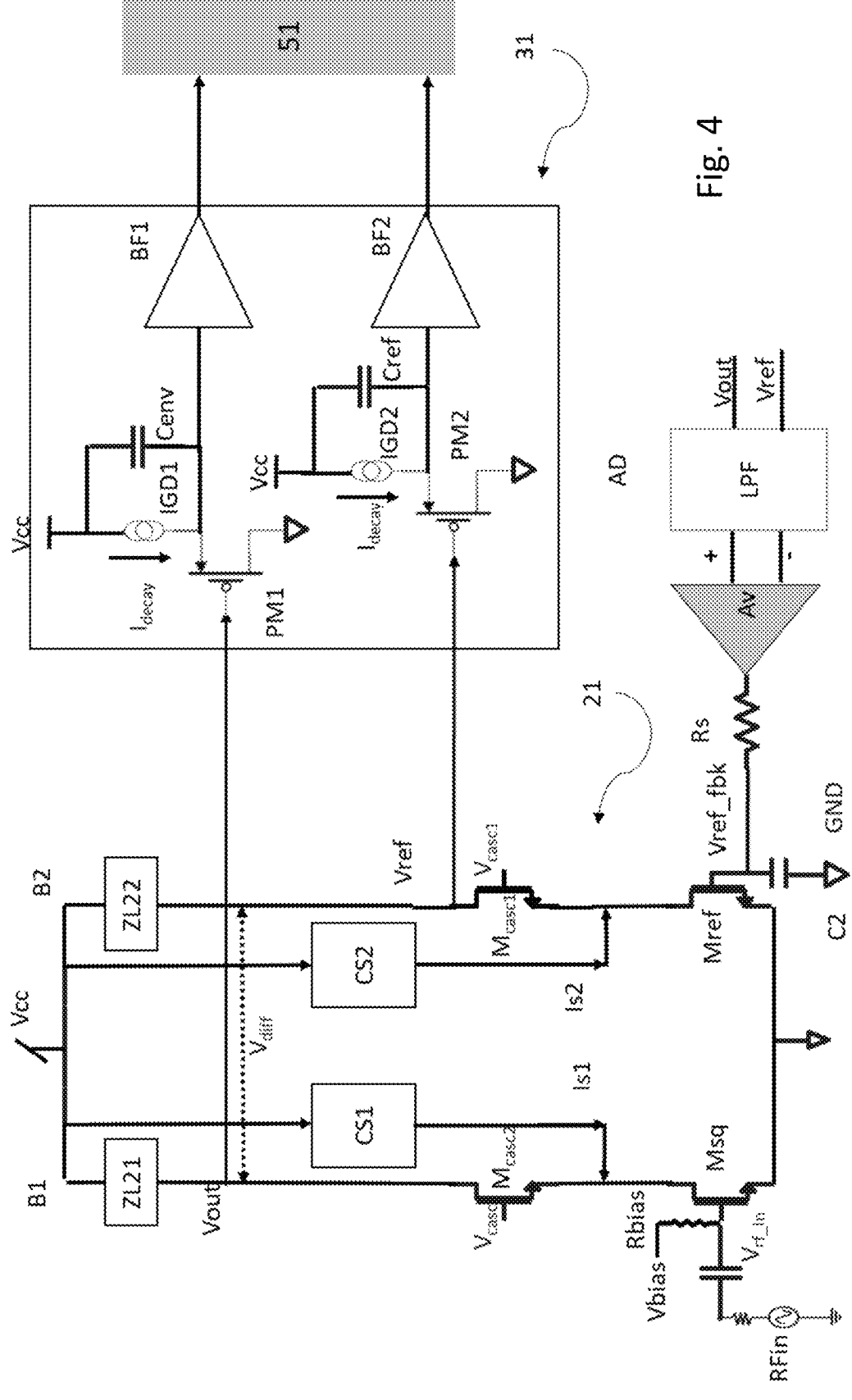
FIG. 4 is a schematic representation of the radiofrequency detector core of FIG. 2 coupled to a first embodiment of an envelope detector.

In FIG. 4 it is shown the RF detector core 21 of FIG. 2 coupled to a first embodiment 31 of an envelope detector.

The envelope detector 31 comprises a first pMOS PM1 which gate is coupled to the output voltage Vout on the squarer branch B1, and which drain is coupled to ground GND. The source of the first pMOS PM1 is coupled to the supply voltage Vcc through a decay current generator IGD1 injecting a decay current $I_{decay}$ in the source of the first pMOS PM1. An envelope capacitor Cenv is coupled in parallel to the decay current generator IGD1, then the source of the first pMOS PM1 is coupled to the input of a first buffer BF1. The envelope detector 31 then comprises a second pMOS PM2 which gate is coupled to the reference voltage Vref and which drain is coupled to ground GND. The source of the second pMOS PM2 is coupled to the supply voltage Vcc through a respective decay current generator IGD2 injecting the same decay current $I_{decay}$ in the source of the second pMOS PM2. A reference capacitor Cref is coupled in parallel to the decay current generator IGD2, then the source of the second pMOS PM2 is coupled to the input of a second buffer BF2.

The outputs of the buffers BF1 and BF2, at which are present the buffered envelope voltages of the voltages Vout and Vref, are supplied to an analog to digital converter 51, in the example shown, or to further stages, in particular amplification stages, such as logarithmic Amplifiers or Mixer and frequency shift/choppers.

Each branch of the circuit 31, components PM1-IGD1-Cenv-BF1 coupled to the squarer branch B1, or components PM2-IGD2-Cref-BF2 coupled to the reference branch B2, substantially detects an envelope with control of the decay time through the value of the decay current $I_{decay}$. To supply the decay current $I_{decay}$ small generators IGD1, IGD2 may be used as shown, else such current generators may be substituted by a high value resistor.

Figure 5:
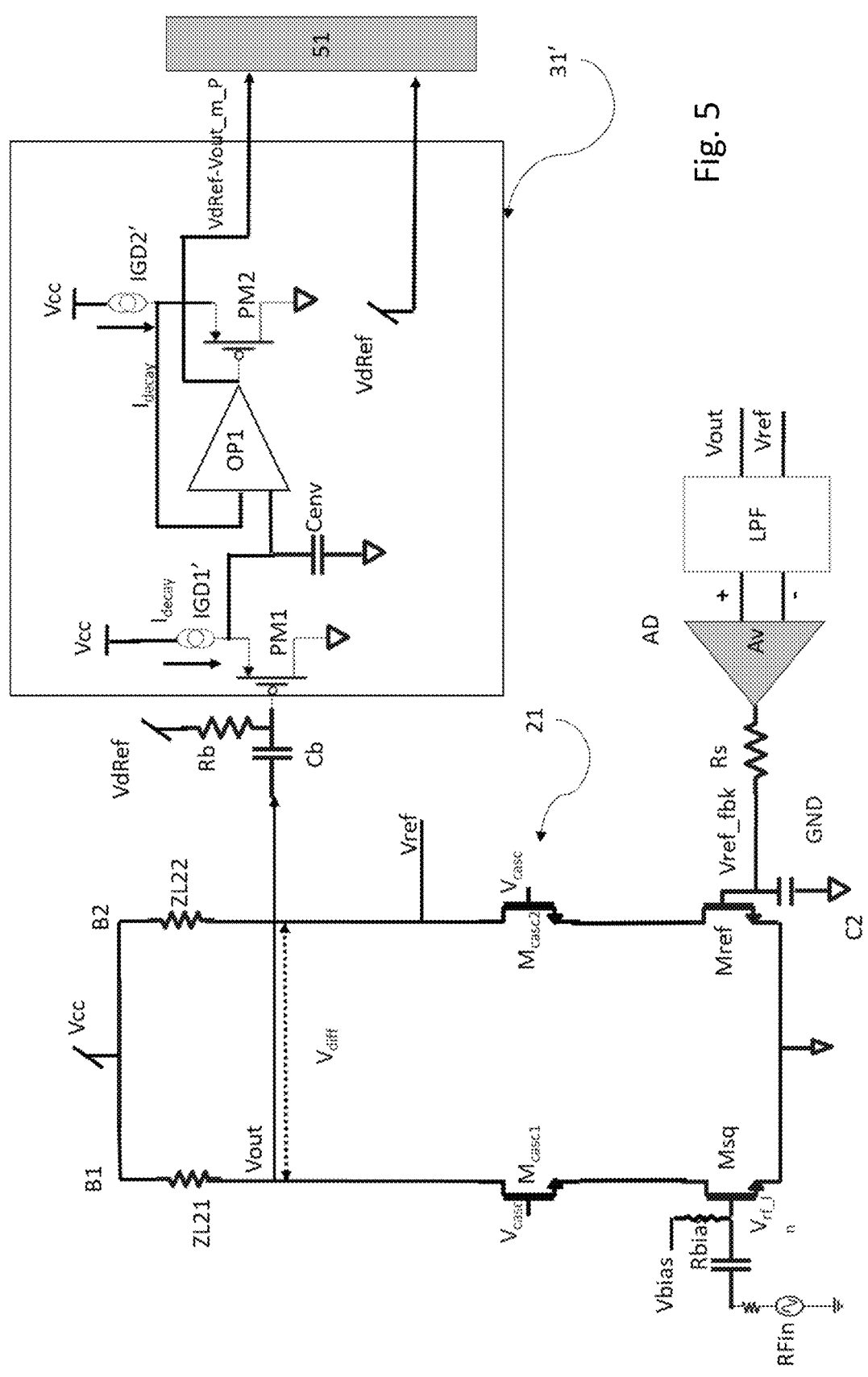
FIG. 5 is a schematic representation of the radiofrequency detector core of FIG. 2 coupled to a second embodiment of an envelope detector.

FIG. 5 is a schematic representation of the radiofrequency detector core of FIG. 2 coupled to a second embodiment of an envelope detector, i.e. differently with respect to the embodiment of FIG. 4 an independent bias detector reference voltage VdRef is used to DC bias the peak detector, 31' in FIG. 5, instead of using the reference voltage Vref used for the DC offset removal of the RF squarer block.

In FIG. 5 thus it is shown the circuit 21 with a variant of envelope detector 31', where the output voltage Vout on the first branch B1 is coupled to the gate of the first pMOS PM1, in particular through a decoupling capacitor Cb, while the gate of the first pMOS PM1 is also coupled to such bias detector reference voltage, VdRef, which may correspond to the reference voltage Vref on branch B2 itself or to another value of DC voltage suitable for representing bias detector reference voltage, selected according to an optimization of the dynamic of the voltage of the envelope detector, where the power is high, e.g. input power Pin>−5 dBm. The first pMOS PM1 is coupled between the ground GND with its drain and the supply voltage Vcc, the latter being through a respective decay current generator IGD1' supplying the same decay current $I_{decay}$ to the source. The source of the first pMOS PM1 is coupled to the input of an operational amplifier OP1, which is also coupled to ground GND by an envelope capacitor Cenv. The output of the operational amplifier OP1 is coupled to the gate of a second pMOS PM2. The second pMOS PM2 also is coupled between the ground GND with its drain and the supply voltage Vcc, the latter being through a respective decay current generator IGD2' supplying the same decay current $I_{decay}$ to its source. However the source is also coupled to the other input of the operational amplifier OP1, feeding back the signal at the source of the secondo pMOS PM2. The voltage at the gate of the second pMOS PM2, which is VdRef−Vout_m_P, Vout_m_P indicating the negative peak of the output voltage Vout, is brought to an input of the digital to analog converter 51, which operates as a differential converter, the bias detector reference voltage, VdRef being brought to the other input thanks to the DC loop built with the differential amplifier OP1 and the pMOS PM2.

As shown this embodiment does not comprise on branches B1, B2 the steering circuits CS1 and CS2 and the squarer load ZL21, ZL22 are embodied by simple resistors. This configuration may also be present in the embodiment of FIGS. 3 and 4, independently from the detector.

The operational amplifier OP1, i.e., a differential amplifier, together with pMOS PM1 and PM2 operates as peak detector, which takes the negative peak of the output voltage Vout and transfers it to the output of the operational amplifier OP1, as difference with respect to the bias reference voltage Vdref, VdRef−Vout_min_Peak, thanks to the shift operated by the second pMOS PM2. The gate source voltages of the first pMOS PM1 and of the second pMOS PM2 are almost the same once the Mos are well matched so that their difference can be neglected.

The differential output of the digital to analog converter 51 provided the desired negative peak Vout_min_Peak that represents the peak or envelope of the RMS detector output.

In both FIGS. 4 and 5, being the squarer circuit corresponding to the squarer circuit 21, the voltage sense Av senses the voltages Vout and Vref at the output of the two branches B1 and B2 respectively through the low pass filter LPF, which filters each of voltages Vout and Vref, and closes the loop acting on the feedback reference voltage $V_{ref\_fbk}$ applied to the control input of the second reference MOSFET M2.

Thus, summarizing, the proposed solutions refer to radiofrequency detector comprising a squarer circuit, e.g. 21; 21', comprising a first and second branch coupled between a voltage supply, e.g. Vcc, and ground, e.g., GND, the first branch B1 comprising at least a first squarer transistor, usually M1 or M1, M1' for the differential version, receiving a RF sinusoidal input voltage, the first squarer transistor being coupled to the voltage supply through a respective load, e.g. ZL21, the second branch B2 comprising a second reference transistor, in the examples M2, which in particular is only biased by the same gate source voltage Vgs of the first transistor M1, the second reference transistor M2 being coupled to the voltage supply through a respective load, e.g. ZL22, an output voltage, e.g. Vout, being formed at an output node of the first branch B1 and a reference voltage, e.g. Vref, being formed at a respective output node, in particular coupled to the load ZL21; Zl22, i.e. this meaning that the output is taken to on the output of the transistor or cascoded transistor coupled to the load, of the second branch B2, a squared voltage being obtained by a difference voltage Vdiff of the output voltage Vout and reference voltage Vref. The solutions provide that the squarer circuit, e.g. 21, 21', is configured to feed back to a control electrode, e.g. either the gate or the bulk electrode, of the second reference transistor M2 a feedback signal Vref_fbk, which is function of the difference voltage Vdiff. In embodiments such function means simply feeding directly back the output voltage Vout and reference voltage Vref, or a low pass filtered version of such signals, in particular to the sense amplifier.

Thus, the solutions refer then in embodiments to a radiofrequency detector where the circuit, e.g., 21, 21', comprises a sense amplifier Av to which inputs are coupled the output voltage, e.g., Vout, and the reference voltage, e.g., Vref, the sense amplifier (AD) being configured to output a signal, e.g., Vref_fbk, proportional to the difference voltage, e.g., Vdiff, of the signals at the inputs of the sense amplifier, e.g., AD, which is applied to a control electrode of the second reference transistor M2.

The squarer circuit, e.g., 21; 21', may comprise a cascode transistor, e.g., Mcasc1, Mcasc2, on each of such first branch B1 and second branch B2, arranged between the first or second transistor, e.g., M1, M2, respectively, and a current steering circuit, e.g., CS1, CS2, injecting current, e.g., IS1, IS2, in the node in common between the first or second transistor, e.g., M1, M2, and the respective cascode transistor, e.g., Mcasc1, Mcasc2.

In particular the control electrode of the second reference transistor, e.g., M2, is the gate of such second reference transistor (M2), while in other embodiments the control electrode of the second reference transistor, e.g., M2, is a bulk electrode gate of the second reference transistor (M2).

The detector preferably comprises a low pass filter LPF receiving the output voltage Vout and reference voltage Vref and outputting corresponding low pass filtered signals to the inputs the sense amplifier AD.

The squarer circuit may be single ended or may be differential and comprises two squarer transistors, e.g., M1$p$, M1$n$, in parallel receiving at input the positive Vrfp and negative Vrfn RF input signal.

The detector may comprise an envelope detector, e.g. 31, 31', coupled at least to the output voltage Vout comprising at least a pMOS, e.g., at least pMOS PM1, coupled by its gate to at least one of the first and second branch, B1 and B2, in FIG. 4 PM1 coupled to B1 at least, and which output node is coupled through a respective capacitor e.g. Cenv for the pMOS PM1, to a voltage supply node Vcc or to a ground reference node GND. In the embodiment of FIG. 4 is the voltage supply node Vcc while in the embodiment of FIG. 5 is ground GND.

As shown in FIG. 4, the envelope detector 31 may comprise a second pMOS PM2 receiving at its gate the reference voltage Vref and which output is coupled to the power supply Vcc) by a further respective capacitor Cref, in particular the output of the first and second pMOS, PM1, PM2, being coupled to a respective buffer, e.g., BF1, BF2.

As shown in FIG. 5, in the envelope detector 31' may applied a respective detector refence voltage, e.g., Vdref to the gate of the at least a pMOS, PM1, PM2, the respective capacitor Cenv being coupled to ground GND and to the input of a differential amplifier OP1 which output is coupled to the gate of a second pMOS PM2 which output is coupled back to the other input of the differential amplifier OP1, in particular the output of the second pMOS PM2, in particular its source.

As shown in FIGS. 4 and 5, the source of the first pMOS PM1 and/or of the second pMOS PM2 may be coupled to the supply voltage Vcc through a decay current generator IGD1 injecting a decay current $I_{decay}$ in the source of the first pMOS PM1. In the examples shown, both pMOS PM1 and PM2 are coupled to decay current generators IGD1, IGD2 or IGD1', IGD2'.

From the description here above thus the advantages of the solutions described are apparent.

The proposed solutions, in particular by feeding back to a control electrode of the reference transistor a feedback signal, which is a function of the difference voltage, enhances the sensitivity for RF low power input level, without requiring trimming and/or calibration procedure, or complex artefacts with digital loops to get the necessary minimum sensitivity and the dynamic range required from RF AGC closed loop systems.

Another remarkable advantage is the dynamic DC offset recovery with a very stable RMS trans-char without interruption or slowdown of the RMS Detector and/or AGC operations.

The proposed solutions allow this by proposing a RF RMS Detector with autonomous DC offset compensation loop.

Without prejudice to the underlying principles, the details and embodiments may vary, even significantly, with respect to what has been described by way of example only, without departing from the extent of protection.

The solutions here described are to applied in apparatus operating at radiofrequency, in particular in the range of high frequencies (HF) or very high frequencies (VHF), for instance in car radios, e.g. wide band (25 MHz) and dual tuner band (35 MHz). The solutions may be applied for instance in the 2.3 . . . 24 GHz frequency range. In general, the solutions here described preferably operate with a working frequency higher than the bandwidth of the DC offset compensation loop to avoid an attenuated response of the detector.

The extent of protection is defined by the annexed claims.

What is claimed is:

1. A radiofrequency detector comprising:
   a squarer circuit comprising:
   a first branch coupled between a voltage supply and ground, the first branch comprising a first squarer transistor configured to receive a radiofrequency sinusoidal input voltage, wherein the first squarer transistor is coupled to the voltage supply through a first load; and
   a second branch coupled between the voltage supply and the ground, the second branch comprising a second reference transistor coupled to the voltage supply through a second load, wherein an output voltage is formed at an output node of the first branch and a reference voltage is formed at a respective output node coupled to the second load of the second branch, and wherein a squared voltage is obtained by a difference voltage of the output voltage and the reference voltage;
   wherein the squarer circuit is configured to feed back to a control electrode of the second reference transistor a feedback signal that is a function of the difference voltage.

2. The radiofrequency detector of claim 1, wherein the squarer circuit comprises a sense amplifier having inputs coupled to the output voltage and the reference voltage, wherein the sense amplifier is configured to output a signal proportional to the difference voltage of the output voltage and the reference voltage, to the control electrode of the second reference transistor.

3. The radiofrequency detector of claim 2, wherein the squarer circuit comprises a cascode transistor on each of the first branch and the second branch, arranged between the first squarer transistor or the second reference transistor, respectively, and a current steering circuit injecting current in the respective node in common between the first squarer transistor or the second reference transistor, respectively, and the respective cascode transistor.

4. The radiofrequency detector of claim 1, wherein the control electrode of the second reference transistor is a gate of the second reference transistor.

5. The radiofrequency detector of claim 1, wherein the control electrode of the second reference transistor is a bulk electrode gate of the second reference transistor.

6. The radiofrequency detector of claim 2, further comprising a low pass filter configured to receive the output voltage and the reference voltage, and output corresponding low pass filtered signals to the inputs of the sense amplifier.

7. The radiofrequency detector of claim 1, wherein the squarer circuit is single ended.

8. The radiofrequency detector of claim 1, wherein the squarer circuit is differential and comprises two squarer transistors in parallel configured to receive as input positive and negative RF input signals.

9. The radiofrequency detector of claim 1, wherein the first squarer transistor and the second reference transistor are metal-oxide-semiconductor field-effect transistors (MOS-FETs).

10. The radiofrequency detector of claim 1, further comprising an envelope detector coupled to at least the first branch, wherein the envelope detector comprises a first p-channel MOS (pMOS) transistor coupled by its gate to the output voltage and having an output through a respective capacitor to a voltage supply node or to a ground reference node.

11. The radiofrequency detector of claim 10, wherein the envelope detector further comprises a second pMOS transistor coupled by its gate to the reference voltage and having an output coupled to the voltage supply by a further respective capacitor, and wherein the outputs of the first and second pMOS transistors are coupled to respective buffers.

12. The radiofrequency detector of claim 10, wherein the envelope detector is configured to apply a respective detector refence voltage to the gate of the first pMOS transistor, wherein the respective capacitor is coupled to the ground and to a first input of a differential amplifier having an output coupled to a gate of a second pMOS transistor having an output coupled back to a second input of the differential amplifier.

13. The radiofrequency detector of claim 10, wherein a source of the first pMOS transistor is coupled to the voltage supply through a decay current generator configured to inject a decay current in the source of the first pMOS transistor.

14. The radiofrequency detector of claim 11, wherein the output of the buffer coupled to the second pMOS transistor, or the output of the second pMOS transistor, is coupled to an analog to digital converter.

15. A method of operating a radiofrequency detector, the radiofrequency detector comprising a squarer circuit comprising first and second branches coupled between a voltage supply and ground, the first branch comprising a first squarer transistor coupled to the voltage supply through a first load, the second branch comprising a second reference transistor coupled to the voltage supply through a second load, the method comprising:

receiving, by the first squarer transistor, a radiofrequency sinusoidal input voltage;

generating an output voltage at an output node of the first branch;

generating a reference voltage at a respective output node coupled to the second load of the second branch;

obtaining a squared voltage from a difference voltage of the output voltage and the reference voltage; and feeding back to a control electrode of the second reference transistor a feedback signal that is a function of the difference voltage.

16. The method of claim 15, wherein the squarer circuit comprises a sense amplifier having inputs coupled to the output voltage and the reference voltage, and the method further comprises:

outputting, by the sense amplifier, a signal proportional to the difference voltage of the output voltage and the reference voltage, to the control electrode of the second reference transistor.

17. The method of claim 16, wherein the squarer circuit comprises a cascode transistor on each of the first branch and the second branch, arranged between the first squarer transistor or the second reference transistor, respectively, and the method further comprises:

injecting, by a current steering circuit, current in the respective node in common between the first squarer transistor or the second reference transistor, respectively, and the respective cascode transistor.

18. The method of claim 16, further comprising:

receiving, by a low pass filter, the output voltage and the reference voltage; and outputting, by the low pass filter, corresponding low pass filtered signals to the inputs of the sense amplifier.

19. The method of claim 15, wherein the radiofrequency detector further comprises an envelope detector comprising a first p-channel MOS (pMOS) transistor coupled by its gate to the output voltage, and a second pMOS transistor coupled by its gate to the reference voltage, and the method further comprises:

using, by the envelope detector, the reference voltage to remove a direct current offset from the squarer circuit.

20. The method of claim 15, wherein the radiofrequency detector further comprises an envelope detector comprising a first p-channel MOS (pMOS) transistor coupled by its gate to the output voltage, an operational amplifier having a first input coupled to an output of the first pMOS transistor and a second input coupled to an output of a second pMOS transistor, and the second pMOS transistor, coupled by its gate to an output of the operational amplifier, and the method further comprises:

receiving, at the gate of the first pMOS transistor, a detector reference voltage; and using, by the envelope detector, the detector reference voltage to direct current bias the envelope detector.

\*    \*    \*    \*    \*